United States Patent
Wu et al.

(10) Patent No.: US 10,395,728 B2
(45) Date of Patent: Aug. 27, 2019

(54) DEMARCATION VOLTAGE DETERMINATION VIA WRITE AND READ TEMPERATURE STAMPS

(71) Applicant: INTEL CORPORATION, Santa Clara, CA (US)

(72) Inventors: Ning Wu, Folsom, CA (US); Shankar Natarajan, Folsom, CA (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 16/019,530

(22) Filed: Jun. 26, 2018

(65) Prior Publication Data
US 2019/0043566 A1    Feb. 7, 2019

(51) Int. Cl.
| G11C 7/00 | (2006.01) |
| G11C 11/56 | (2006.01) |
| G06F 11/10 | (2006.01) |
| G11C 16/28 | (2006.01) |
| G11C 29/02 | (2006.01) |
| G11C 16/10 | (2006.01) |

(52) U.S. Cl.
CPC ...... *G11C 11/5642* (2013.01); *G06F 11/1048* (2013.01); *G11C 11/5628* (2013.01); *G11C 16/10* (2013.01); *G11C 16/28* (2013.01); *G11C 29/028* (2013.01)

(58) Field of Classification Search
CPC ... G11C 7/04; G11C 11/406; G11C 11/40626; G11C 5/147; G11C 5/143
USPC .......................................................... 365/211
See application file for complete search history.

(56) References Cited

U.S. PATENT DOCUMENTS

| 9,208,022 | B2 | 12/2015 | Leem et al. |
| 9,691,492 | B1 | 6/2017 | Querbach et al. |
| 9,934,859 | B1 | 4/2018 | Swaminathan et al. |
| 2016/0099049 | A1* | 4/2016 | Lee ............................... 365/148 |

OTHER PUBLICATIONS

U.S. Appl. No. 15/842,799, filed Dec. 14, 2017, entitled, "Background Data Refresh Using a System Timestamp in Storage Devices", invented by Natarajan et al., Total 28 pp.
Wikipedia, "Trim (computing)", [online], Mar. 22, 2018, retrieved from the Internet at <URL: https://en.wikipedia.org/wiki/Trim_(computing)>, Total 10 pp.

* cited by examiner

*Primary Examiner* — Son T Dinh
(74) *Attorney, Agent, or Firm* — Konrad Raynes Davda & Victor LLP

(57) ABSTRACT

A non-volatile memory receives a request from a controller to read data stored in the memory. Moving read references are adjusted as a function of the temperature of the memory at which the data was written and the temperature of the memory at which the data is to be read. Moving read references may also be adjusted as a function of the retention time of the data to be read and the word line type of the storage elements in which the data is stored.

25 Claims, 7 Drawing Sheets

| Superblock | Write Temperature (C) | Write Timestamp (Secs) | Read Timestamp (Secs) | Data Retention Time (days) | Read Temperature (C) |
|---|---|---|---|---|---|
| S0 | 25 degrees | 600000 | 687000 | 1 | 25 degrees |
| S1 | 45 degrees | 600361 | 859208 | 3 | 25 degrees |
| S2 | 85 degrees | 600722 | 945607 | 4 | 0 degrees |
| S3 | 25 degrees | 600603 | 1810006 | 14 | 70 degrees |
| ⋮ | | | | | |
| Sn | 85 degrees | 601088 | 684504 | 1 | 45 degrees |

FIG. 3

| Die | D0 | | | | D1 | | | | D2 | | | | D3 | | | |
|---|---|---|---|---|---|---|---|---|---|---|---|---|---|---|---|---|
| Plane | P0 | P1 | P2 | P3 | P0 | P1 | P2 | P3 | P0 | P1 | P2 | P3 | P0 | P1 | P2 | P3 |
| Super Block | S0 | | | | | | | | | | | | | | | |
| | S1 | | | | | | | | | | | | | | | |
| | S2 | | | | | | | | | | | | | | | |
| | ⋮ | | | | | | | | | | | | | | | |
| | Sn | | | | | | | | | | | | | | | |

| Level | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|
| Binary Value | 1111 | 0111 | 0011 | 1011 | 1001 | 0001 | 0101 | 1101 | 1100 | 0100 | 0000 | 1000 | 1010 | 0010 | 0110 | 1110 |
| Valley | V0 | V1 | V2 | V3 | V4 | V5 | V6 | V7 | V8 | V9 | V10 | V11 | V12 | V13 | V14 | |
| Read Reference | R0111 | R0011 | R1011 | R1001 | R0001 | R0101 | R1101 | R1100 | R0100 | R0000 | R1000 | R1010 | R0010 | R0110 | R1110 | |

FIG. 8

| Look-up Table Entry | Word Line Type | Write Temperature (C) | Retention Time (days) | Read Temperature (C) | MRR Adjustment Factor Values |
|---|---|---|---|---|---|
| LTE1 | QLC | < 45 degrees | < 1 week | < 45 degrees | Option_1 |
| LTE2 | QLC | > 45 degrees | < 1 week | > 25 degrees | Option_2 |
| LTE3 | SLC | > 85 degrees | < 1 week | < 25 degrees | Option_4 |
| LTE4 | QLC | < 45 degrees | > 1 week | < 45 degrees | Option_5 |
| LTE5 | QLC | < 45 degrees | > 1 week | > 45 degrees | Option_7 |
| ... | ... | ... | ... | ... | ... |
| LTEn | | | | | Option_n |

FIG. 9

| Read Reference | R0111 | R0011 | R1011 | R1001 | R0001 | R0101 | R1101 | R1100 | R0100 | R0000 | R1000 | R1010 | R0010 | R0110 | R1110 |
|---|---|---|---|---|---|---|---|---|---|---|---|---|---|---|---|
| MRR Adjustment Factor | M0111 | M0011 | M1011 | M1001 | M0001 | M0101 | M1101 | M1100 | M0100 | M0000 | M1000 | M1010 | M0010 | M0110 | M1110 |

FIG. 12

| Super Block | Block | Word Line | Page | Write Temperature (C) | Write Timestamp (Secs.) | Read Timestamp (Secs.) | Data Retention Time (days) | Read Temperature (C) |
|---|---|---|---|---|---|---|---|---|
| S0 | 0 | WL0 | PAGE0 | 25 degrees | 60000 | 687000 | 1 | 25 degrees |

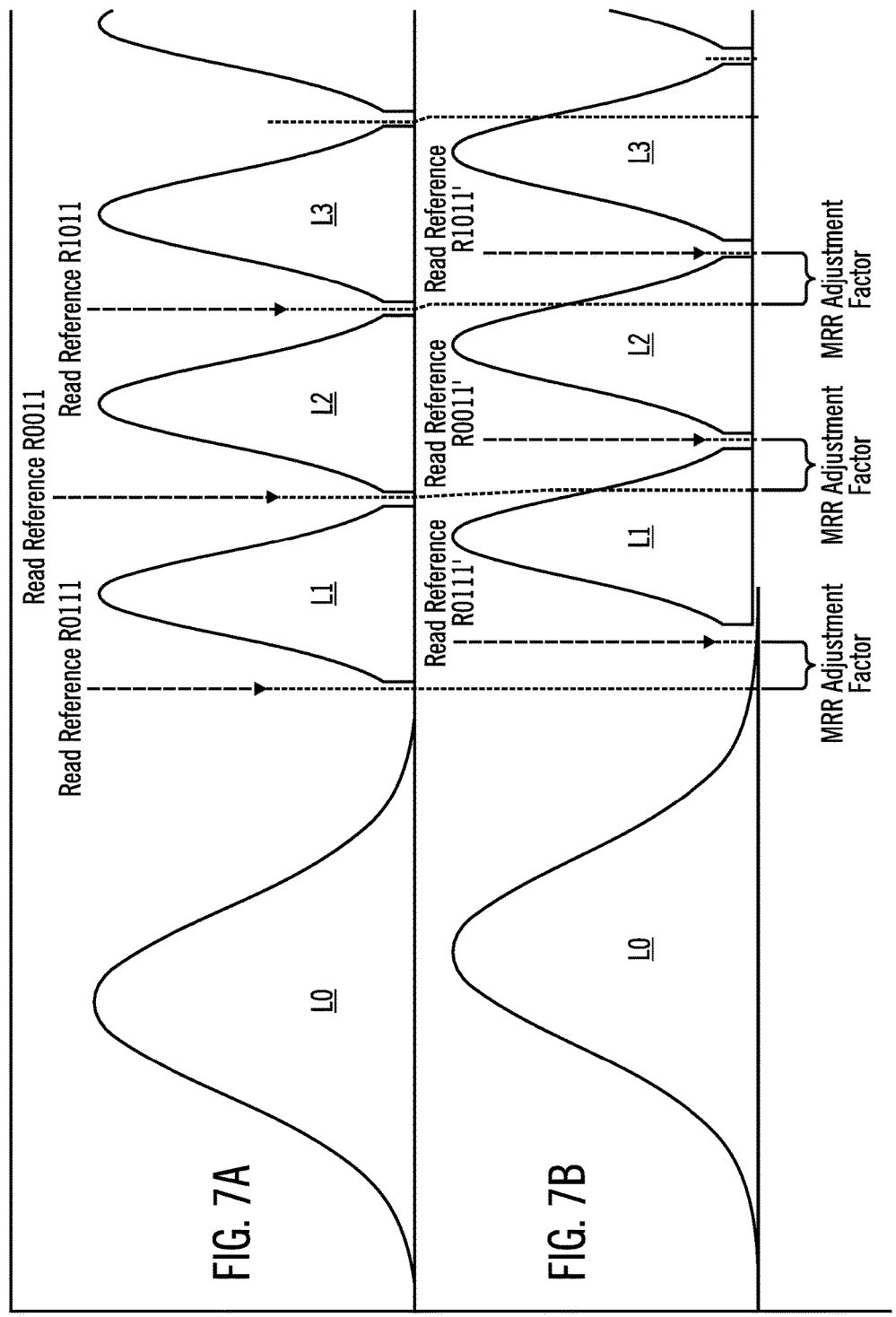

| Super Block | Block | Word Line | Page |
|---|---|---|---|
| S0 | 0 | WL0 | PAGE0 |
| S0 | 0 | WL0 | PAGE1 |
| S0 | 0 | WL0 | PAGE2 |
| S0 | 0 | WL0 | PAGE3 |
| S0 | 0 | WL1 | PAGE4 |
| S0 | 0 | WL1 | PAGE5 |
| S0 | 0 | WL1 | PAGE6 |
| S0 | 0 | WL1 | PAGE7 |
| ... | ... | ... | ... |
| S0 | 0 | WL31 | PAGE764 |
| S0 | 0 | WL31 | PAGE765 |
| S0 | 0 | WL31 | PAGE766 |
| S0 | 0 | WL31 | PAGE767 |

DEMARCATION VOLTAGE DETERMINATION VIA WRITE AND READ TEMPERATURE STAMPS

BACKGROUND

A solid state drive (SSD) is a data storage device that uses integrated circuit assemblies as memory to store data persistently. SSDs have no moving mechanical components and this distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and have less latency. Many types of SSDs use NAND-based flash memory which comprises an electronic (solid-state) non-volatile computer storage medium that can be electrically erased and reprogrammed.

NAND-based flash memory may have bit errors in stored data. To allow recovery from such bit errors, data may be stored in an encoded form in NAND-based flash memory, by using an error correction code (ECC) to encode the data. Error correction techniques may be employed on the encoded data to remove the errors and reconstruct the original data.

Other error correction schemes search for improved read reference voltages in response to read errors. Read failures may originate from numerous error mechanisms and different usage models. These error mechanisms and usage models may alter memory cell threshold voltage (Vt) distributions. Thus, to improve read results, read reference voltage values may be moved to other values at which the reading of the memory cells is retried. This movement of the read reference is referred to as Moving Read Reference (MRR).

MRR schemes can involve numerous attempts to move a read reference before an Error Correction Code (ECC) correctable read reference is found. Large numbers of read retries can result in undesirable high levels of read latency. In order to prevent a large number of re-reads, one approach is to use an MRR table having a fixed number of entries implemented in a fixed order or sequence. However, such fixed MRR tables may not include the optimal set of values or sequence orders due to varying sources of error and different usage conditions.

Another approach is to adapt the values or sequence orders of the MRR table based upon the correction capabilities of various candidate values or sequence orders. As certain values or sequences result in greater rates of read success, the MRR table entries may converge on more optimal settings. However, such adaptations can nonetheless permit high levels of read latency and therefore poor quality of service until the more optimal values or sequence orders are found. Moreover, rates of success may not be sufficient to permit convergence of MRR table entries to values which sufficiently reduce read latency or sufficiently improve quality of service.

If use of such MRR tables to move the read references does not result in ECC correctable read references, other error recovery schemes may be implemented. Also, the memory cell may be deemed as unreadable should the various error recovery schemes all fail.

BRIEF DESCRIPTION OF THE DRAWINGS

Referring now to the drawings in which like reference numbers represent corresponding parts throughout:

FIG. 3 illustrates an example of a data stamp table for use with a memory employing demarcation voltage determination in accordance with the present description;

FIG. 4 depicts an example of a superblock of data distributed over multiple dies and planes of the memory of FIG. 2;

FIG. 6 depicts a table of levels of quad-level cell programming Vt distributions and associated binary values, valleys and read references;

FIGS. 7A and 7B illustrate examples of selected quad-level cell programming Vt distributions;

FIG. 8 depicts an example of a look-up table in which moving read reference (MRR) adjustment factors, may be looked up to adjust read references to be applied in performing a read operation employing demarcation voltage determination in accordance with the present description;

FIG. 9 provides an example of an adjustment factor option which provides multiple adjustment factors association with multiple read references for a quad-level cell programming Vt distribution;

FIG. 12 depicts an example of an entry of a data stamp table having superblock subdivision fields.

DETAILED DESCRIPTION

Figure 1:
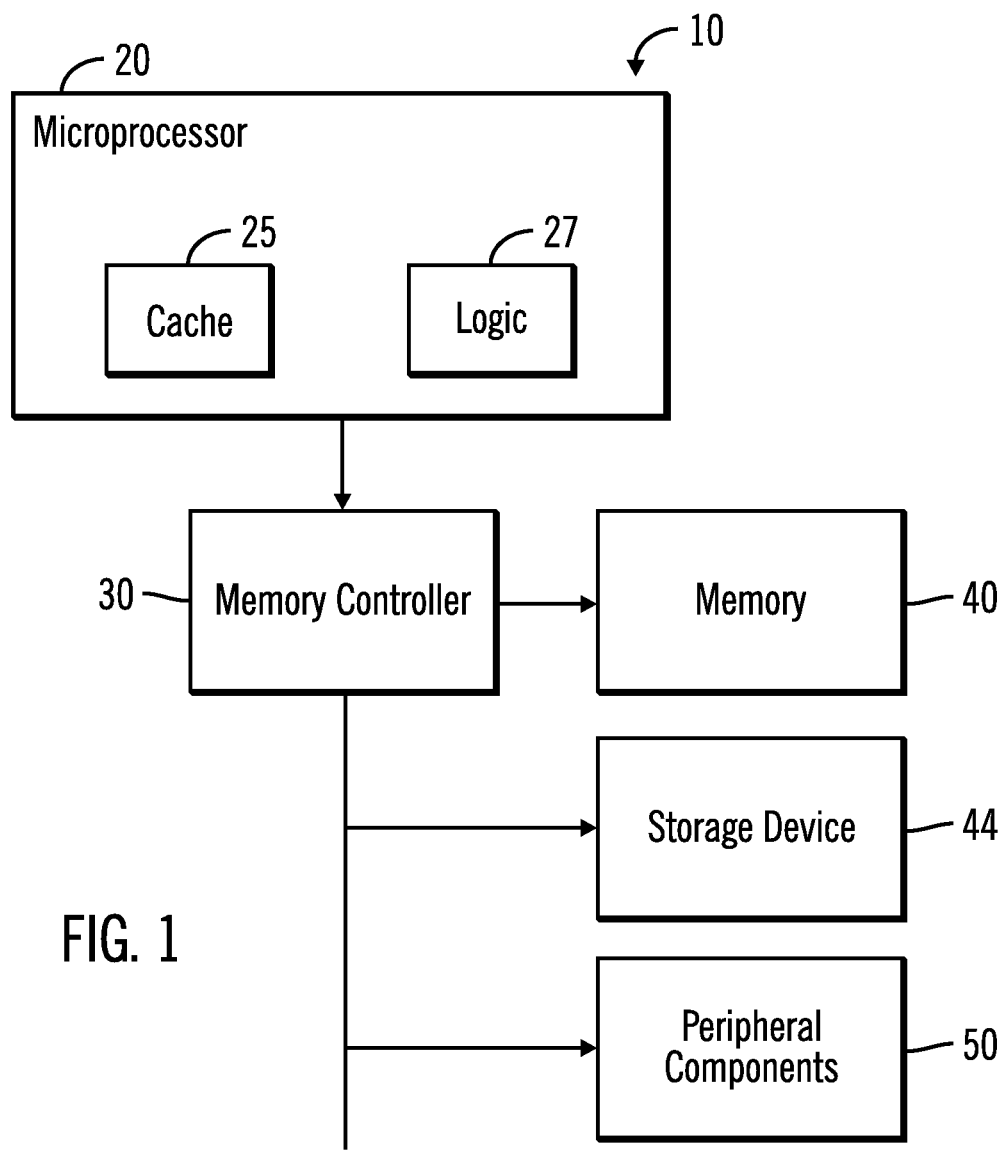
FIG. 1 illustrates a block diagram of a computing environment employing demarcation voltage determination in accordance with certain embodiments, in which a host is coupled to a SSD comprised of NAND memory.

In the following description, reference is made to the accompanying drawings which form a part hereof and which illustrate several embodiments. It is understood that other embodiments may be utilized and structural and operational changes may be made.

Demarcation voltage determination in accordance with the present description is directed to improving the accuracy and success rate of read operations directed to a memory. In addition, latency of read operations may also be reduced. By improving the accuracy and success rate of read operations and reducing their latency, a significant improvement to computer technology is provided.

It is recognized herein that one or more of the levels of a programming threshold voltage (Vt) distributions in a storage element of a memory may shift due to various factors such as a temperature differential between the write temperature at which the data was written to a section of memory such as a superblock of data, and the read temperature at which the data is subsequently read from the superblock. Additional factors which may cause one or more of the programming Vt distributions to shift includes the data retention time between the time the data was written to the superblock, and the time of reading the data from the superblock.

In one aspect of the present description, data stamp logic, in response to a write operation writing data to a superblock of memory, obtains the temperature of the memory at which the write operation is being performed and stores it in a data stamp table of data for that superblock. In addition, the data stamp logic obtains a time stamp indicating the day of the write operation and stores that data in the data stamp table for the superblock.

In response to a subsequent read operation directed to the previously written data of that superblock, the data stamp logic obtains the temperature of the memory at which the read operation is being performed and stores in in the data stamp table for the superblock. In addition, the data stamp logic obtains a time stamp indicating the day of the read operation and uses it to calculate and store the retention time for the data of the read operation, in the data stamp table for the superblock.

In another aspect of the present description, voltage demarcation logic retrieves the stored write temperature, read temperature and retention time conditions for the superblock and identifies a look-up table entry having the closest match to these write temperature, read temperature and retention time conditions for a storage element having the same word line type such as single level cell (SLC), triple level cell (TLC), quad level cell (QLC), etc. Having identified the look-up table entry having the closest match to these write temperature, read temperature and retention time conditions for a storage element having the same word line type, the demarcation logic obtains from the identified look-up table entry a MRR adjustment factor to adjust read reference voltages of the storage elements for the read operation directed to those storage elements.

For example, the MRR adjustment factor may define a positive incremental voltage as the MRR adjustment factor which adjusts the read references to compensate for a rightward shift and widening of the cell programming Vt distributions.

Having adjusted the read reference voltages for reading the storage elements of the superblock, read logic performs the read operation with read reference voltages adjusted by the MRR adjustment factor or factors obtained from the look-up table entry. As a result, read accuracy, read success rate and read latency reduction for those storage elements may be improved notwithstanding shifting or widening of quad-level cell programming Vt distributions due to cross temperature and/or data retention time issues affecting the read operation.

In known for SSDs to rely at least initially on error correction codes (ECC) to allow correction of bit errors in the data stored in NAND-based flash memories. One commonly used error correction code used in SSDs is the low density parity check (LDPC) code. Data encoded via an LDPC code is referred to as LDPC encoded data, where the LDPC encoded data may also be referred to as a codeword. The NAND-based flash memories of a SSD may store LDPC encoded data.

Read reference voltages are a set of voltages which may be used by a controller of a SSD to read the LDPC encoded data from the NAND-based flash memory. A decoder in the controller may decode the LPDC encoded data. Many types of decoders for LDPC encoded data, such as, min-sum decoders, bit flipping decoders, etc., are in use for decoding LDPC encoded data. The errors in data encoded via LDPC may be removed by decoding the LDPC encoded data.

Syndrome decoding is a known mechanism that is used in the decoding of LDPC encoded data. From the syndrome weight determined during syndrome decoding, it is possible to determine the likelihood of successful LDPC decoding of the data. Successful LDPC decoding of data means that the original data is recovered by decoding the LDPC encoded data that has bit errors. If errors exceed a certain threshold then the LDPC decoding will fail, i.e., the LDPC decode process is unable to correct for the bit errors in LDPC encoded data.

In certain known mechanisms, a read operation from the NAND memory may be comprised of first performing a hard bit read (HBR) from the controller on the LDPC encoded data stored in the NAND memory. In HBR, the LDPC encoded data is read from the NAND memory as so-called "hard data" (i.e., the logical high and low bit levels in the LDPC encoded data are taken as a "1" and "0", respectively). The HBR is performed at a first reference voltage. Different reference voltages used for reading may lead to different amounts on errors in the data read from the NAND memory. If LDPC decode fails at the controller on the retrieved LDPC encoded data, then another read reference voltage [referred to as a moving read reference (MRR)] for another HBR may be attempted by the controller to read the LDPC encoded data once again. If the read operation based on the MRR fails, then a soft bit read (SBR) is attempted by the controller. In SBR, the LDPC encoded data is read from the NAND memory as so-called "soft data" (i.e., the logical high and low bit levels in the LDPC encoded data are taken as "1" and "0", respectively, and probability information is provided indicating the likelihood that a respective bit in the LDPC encoded data is a "1" or "0"). Multiple reads are performed during the SBR. The likelihood of success (i.e., retrieving the original data from the LDPC encoded data) is higher in SBR than in HBR.

Multiple reads from the NAND memory may lead to a degradation of the quality of service (QoS) as the LDPC encoded data has to be transferred multiple times from the NAND memory to the controller. The effect of performing this multi stage attempt at LDPC decoding is that the latency of each of the stages become additive and impacts the overall latency of the LDPC decoding. Certain known mechanisms transfer data from the NAND memory to the controller only if the likelihood of LDPC decode success in the controller is high enough. Logic within the NAND determines whether or not to transfer the LDPC encoded data to the controller, based on the syndrome computed by the logic, where the syndrome weight determined while computing the syndrome provides an estimate of the likelihood of LDPC decode success in the controller. This results in a potential quality of service improvement for the SSD.

Demarcation voltage determination in accordance with the present description may be employed with known ECC and MRR techniques to reduce the occurrence of unsuccessful attempts at decoding which increase the latency of read operations. For example, demarcation voltage determination in accordance with the present description may permit ECC correctable read references to be more quickly obtained providing a significant improvement in computer technology. However, it is appreciated that features and advantages of employing demarcation voltage determination in a non-volatile storage memory component in accordance with the present description may vary, depending upon the particular application.

Components employing demarcation voltage determination in accordance with the present description can be used either in stand-alone memory components, or can be embedded in microprocessors and/or digital signal processors (DSPs). Additionally, it is noted that although systems and processes are described herein primarily with reference to microprocessor based systems in the illustrative examples, it will be appreciated that in view of the disclosure herein, certain aspects, architectures, and principles of the disclosure are equally applicable to other types of device memory and logic devices.

Implementations of the described techniques may include hardware, a method or process, or computer software such a memory component driver on a computer-accessible medium. Thus, embodiments include corresponding computer systems, apparatus, and computer programs recorded on one or more computer storage devices, each configured to perform the actions of the methods.

Operations described herein are performed by logic which is configured to perform the operations either automatically or substantially automatically with little or no system operator intervention, except where indicated as being performed manually such as user selection. Thus, as used herein, the term "automatic" includes both fully automatic, that is operations performed by one or more hardware or software controlled machines with no human intervention such as user inputs to a graphical user selection interface. As used herein, the term "automatic" further includes predominantly automatic, that is, most of the operations (such as greater than 50%, for example) are performed by one or more hardware or software controlled machines with no human intervention such as user inputs to a graphical user selection interface, and the remainder of the operations (less than 50%, for example) are performed manually, that is, the manual operations are performed by one or more hardware or software controlled machines with human intervention such as user inputs to a graphical user selection interface to direct the performance of the operations.

Many of the functional elements described in this specification have been labeled as "logic," in order to more particularly emphasize their implementation independence. For example, a logic element may be implemented as a hardware circuit comprising custom Very Large Scale Integrated (VLSI) circuits or gate arrays, off-the-shelf semiconductors such as logic chips, transistors, or other discrete components. A logic element may also be implemented in firmware or programmable hardware devices such as field programmable gate arrays, programmable array logic, programmable logic devices or the like.

A logic element may also be implemented in software for execution by various types of processors. A logic element which includes executable code may, for instance, comprise one or more physical or logical blocks of computer instructions which may, for instance, be organized as an object, procedure, or function. Nevertheless, the executables of an identified logic element need not be physically located together, but may comprise disparate instructions stored in different locations which, when joined logically together, comprise the logic element and achieve the stated purpose for the logic element.

Indeed, executable code for a logic element may be a single instruction, or many instructions, and may even be distributed over several different code segments, among different programs, among different processors, and across several non-volatile memory devices. Similarly, operational data may be identified and illustrated herein within logic elements, and may be embodied in any suitable form and organized within any suitable type of data structure. The operational data may be collected as a single data set, or may be distributed over different locations including over different storage devices.

Turning to the figures, FIG. 1 is a high-level block diagram illustrating selected aspects of a system implemented according to an embodiment of the present disclosure. System 10 may represent any of a number of electronic and/or computing devices, that may include a memory device. Such electronic and/or computing devices may include computing devices such as a mainframe, server, personal computer, workstation, telephony device, network appliance, virtualization device, storage controller, portable or mobile devices (e.g., laptops, netbooks, tablet computers, personal digital assistant (PDAs), portable media players, portable gaming devices, digital cameras, mobile phones, smartphones, feature phones, etc.) or component (e.g. system on a chip, processor, bridge, memory controller, memory, etc.). In alternative embodiments, system 10 may include more elements, fewer elements, and/or different elements. Moreover, although system 10 may be depicted as comprising separate elements, it will be appreciated that such elements may be integrated on to one platform, such as systems on a chip (SoCs). In the illustrative example, system 10 comprises a central processing unit or microprocessor 20, a memory controller 30, a memory 40, a storage drive 44 and peripheral components 50 which may include, for example, video controller, system clock, input device, output device, additional storage, network interface or adapter, battery, etc.

The microprocessor 20 includes a cache 25 that may be part of a memory hierarchy to store instructions and data, and the system memory may include both volatile memory as well as the memory 40 depicted which may include a non-volatile memory. The system memory may also be part of the memory hierarchy. Logic 27 of the microprocessor 20 may include a one or more cores, for example. In some embodiments, the logic 27 may also include a system clock. Communication between the microprocessor 20 and the memory 40 may be facilitated by the memory controller (or chipset) 30, which may also facilitate in communicating with the storage drive 44 and the peripheral components 50. The system may include an offload data transfer engine for direct memory data transfers.

Storage drive 44 includes non-volatile storage and may be implemented as, for example, solid-state drives, magnetic disk drives, optical disk drives, storage area network (SAN), network access server (NAS), a tape drive, flash memory, persistent memory domains and other storage devices employing a volatile buffer memory and a nonvolatile storage memory. The storage may comprise an internal storage device or an attached or network accessible storage. The microprocessor 20 is configured to write data in and read data from the memory 40 and storage 44. Programs in the storage are loaded into the memory 40 and executed by the microprocessor 20. A network controller or adapter enables communication with a network, such as an Ethernet, a Fiber Channel Arbitrated Loop, etc. Further, the architecture may, in certain embodiments, include a video controller configured to render information on a display monitor, where the video controller may be embodied on a video card or integrated on integrated circuit components mounted on a motherboard or other substrate. An input device is used to provide user input to the microprocessor 20, and may include a keyboard, mouse, pen-stylus, microphone, touch sensitive display screen, input pins, sockets, or any other activation or input mechanism known in the art. An output device is capable of rendering information transmitted from the microprocessor 20, or other component, such as a display monitor, printer, storage, output pins, sockets, etc. The network adapter may be embodied on a network card, such as a peripheral component interconnect (PCI) card, PCI-express, or some other input/output (I/O) card, or on integrated circuit components mounted on a motherboard or other substrate.

One or more of the components of the device 10 may be omitted, depending upon the particular application. For example, a network router may lack a video controller, for example. Any one or more of the devices of FIG. 1 including the cache 25, memory 40, storage drive 44, system 10, memory controller 30 and peripheral components 50, may include a nonvolatile storage memory component having demarcation voltage determination in accordance with the present description.

One example of a nonvolatile storage memory of a nonvolatile storage memory component in accordance with the present description is a 3-dimensional (3D) crosspoint memory, and other types of byte-addressable, write-in-place non-volatile memory. In some embodiments, 3D crosspoint memory may comprise a transistor-less stackable cross point architecture in which memory cells sit at the intersection of word lines and bit lines and are individually addressable and in which bit storage is based on a change in bulk resistance.

In one embodiment, the memory device is a block addressable memory device, such as those based on NAND or NOR technologies. A memory device may also include future generation nonvolatile devices, such as a three dimensional crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 2:
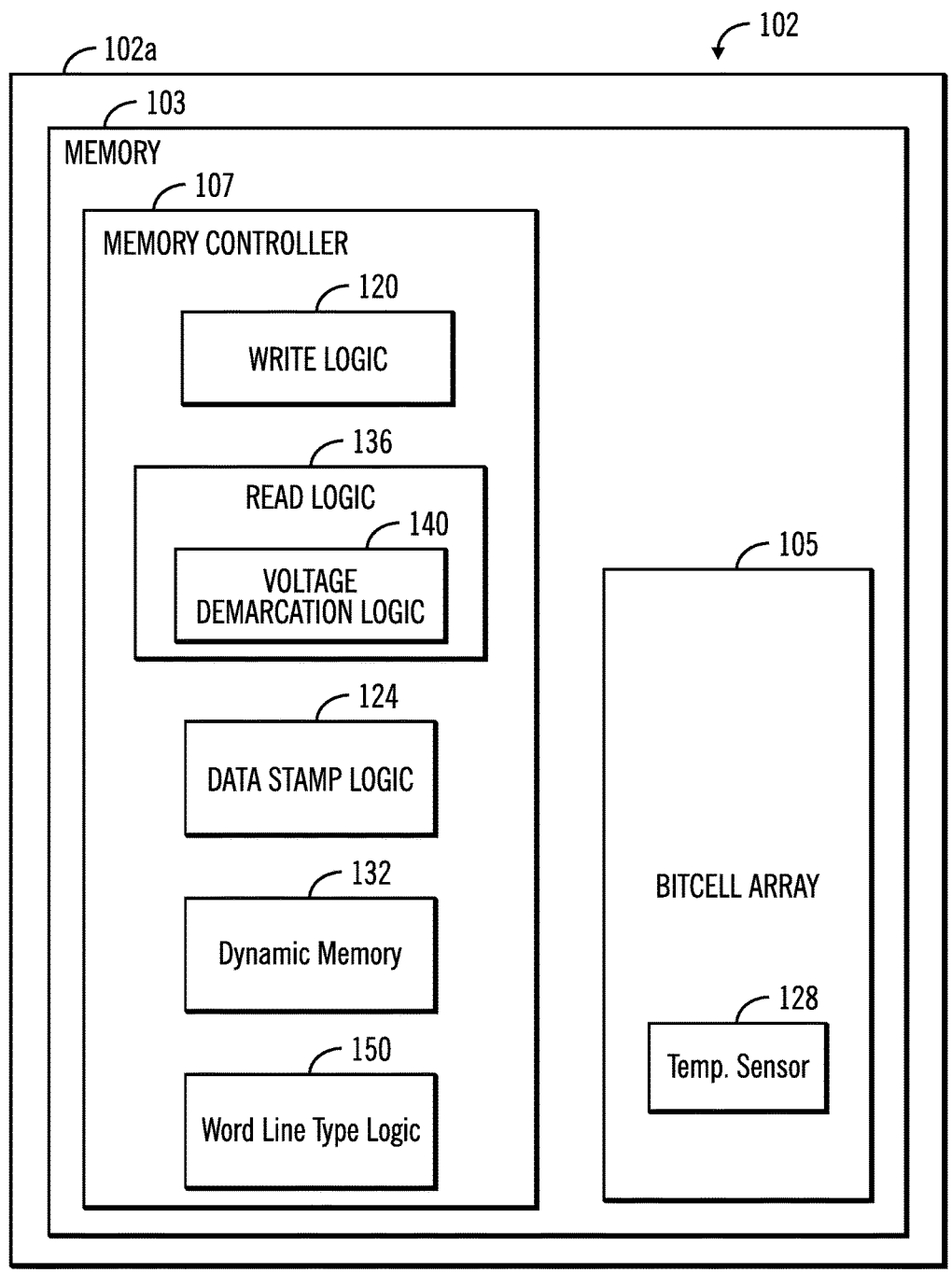
FIG. 2 illustrates an example of a memory of the computing environment of FIG. 1, employing demarcation voltage determination in accordance with the present description.

FIG. 2 shows one example of a nonvolatile storage memory component in accordance with the present description. In this example, the nonvolatile storage memory component is a solid state drive 102 of the storage devices 44 (FIG. 1) of the system 10. The drive 102 has a drive housing 102a which connects the drive 102 to the system 10 as shown in FIG. 1. The drive housing 102a encloses a memory or storage device 103 having an array 105 of nonvolatile bitcells such as an array of NAND bitcells, configured to store data in a persistent manner, and a memory controller 107 configured to control memory read and memory write operations directed to the bitcell array 105.

In one embodiment, the bitcell array 105 may includes cells of a single level cell (SLC), a triple level cell (TLC), quad level cell (QLC or other multilevel cell (MLC) word line types. In a QLC memory embodiment, the bitcell array 105 may be organized in blocks and planes, such as 736 blocks per plane, for example, 2944 blocks per logical unit (LUN), and 16 K bytes per block (plus metadata). It is appreciated that the bitcell array 105 may be organized in units and subunits of other sizes and types, depending upon the particular application.

Referring to both FIG. 2, the memory controller 107 further includes write logic 120 configured to write a set of write data such as a band or superblock of blocks of data, for example, to the bitcell array 105. In accordance with one aspect of demarcation voltage determination in accordance with the present description, a data stamp logic 124 is configured to, in response to a write operation by the write logic 120, obtain a write temperature value provided by a temperature sensor such as the temperature sensor 128 thermally coupled to the bitcell array 105. The data stamp logic 124 is further configured to store the write temperature value provided by the temperature sensor 128 as a stored temperature value to indicate the temperature of the storage elements of the bitcell array 105 at or about the time of the write operation. In the illustrated embodiment, the temperature sensor 128 is disposed on at least one die of the die or dies on which the bitcell array 105 is disposed. It is appreciated that a suitable temperature sensor may be disposed on other dies of the memory 103 or the system 10 (FIG. 1) to provide a write temperature value associated with the write operation.

In the illustrated embodiment, the data stamp logic 124 stores the write temperature value provided by the temperature sensor 128 in a table, an example of which is depicted as a data stamp table in FIG. 3. The data stamp table of FIG. 3 has an entry for each superblock S0, S1 . . . Sn of the bitcell array 105. In the illustrated embodiment, the bitcell array 105 is disposed on four semiconductor dies, D0, D1, D2, D3 (FIG. 4) and each semiconductor die D0, D1, D2, D3 has storage elements disposed in each of four planes P0, P1, P2, P3. It is appreciated that the number of dies in a bitcell array and the number of planes of storage elements in a memory die, may vary, depending upon the particular application employing demarcation voltage determination in accordance with the present description.

The storage elements of at least a portion of the bitcell array 105 are grouped into superblocks which span over the dies D0, D1, D2, D3 of the bitcell array 105 and which span over the planes P0, P1, P2, P3 of each die D0, D1, D2, D3, respectively, of the bitcell array 105 as shown in FIG. 4. Thus, the superblock S0, for example, includes storage elements in each of the dies D0, D1, D2, D3 of the bitcell array 105 and includes storage elements in each of the planes P0, P1, P2, P3 of each die D0, D1, D2, D3, respectively, of the bitcell array 105. For example, in the illustrated example, superblock S0 includes block 0 in each plane of each die.

In the example of FIG. 3, the first entry of the data stamp table is for the superblock S0 as indicated in the "Superblock" field of the data stamp table of FIG. 3. At the time data was written into the superblock S0, the temperature sensor 128 indicated a write temperature of 25 degrees Celsius (C) in this example. Accordingly, in the entry for the superblock S0, the data stamp logic 124 stores the write temperature value 25 degrees C. in the "Write Temperature" field of the data stamp table of FIG. 3.

In the illustrated embodiment, the data stamp table of FIG. 3 has an entry for each superblock of the bitcell array 105. However, it is appreciated that other subdivisions of the bitcell array 105 may be utilized to increase the granularity for entries in a data stamp table of a memory employing demarcation voltage determination in accordance with the present description. For example, a data stamp table may have an entry for each die, plane, block, sub-block, word line, group of word lines, page, section, word, byte, or other granularity, depending upon the particular application. Accordingly, stamp data may be entered for both partial (open) and full (closed) superblocks.

In accordance with one aspect of demarcation voltage determination in accordance with the present description, the data stamp logic 124 is further configured to, in response to a write operation by the write logic 120, obtain a write clock value provided by a clock such as a system clock of the peripheral components 50 (FIG. 1) for example. The data stamp logic 124 is further configured to store the write clock value provided by the system clock as a stored write clock value to indicate when the write operation occurred.

In the illustrated embodiment, the data stamp logic 124 stores the write clock value provided by the system clock in a table, such as the data stamp table of FIG. 3, for example. For example, as noted above, the first entry of the data stamp table of FIG. 3 is for the superblock S0 as indicated in the "Superblock" field of the table of FIG. 3. At the time data was written into the superblock S0, the system clock indicated a write clock value of 600000 seconds in this example. Accordingly, in the entry for the superblock S0, the data stamp logic 124 stores the write clock value 600000 seconds in the "Write Timestamp" field of the superblock S0 entry of the data stamp table of FIG. 3. Although the timestamps of FIG. 3 are denoted in seconds, it is appreciated that other granularities of time can be used (e.g., milliseconds, minutes, hours, days, or other units of time). Similarly, although the table in FIG. 3 illustrates an example in which timestamps for each superblock are stored, other granularities can be used. For example, the data stamp logic 124 can store timestamp information for each block, or only for blocks or superblocks that have been written to, or for other granularities.

In the illustrated embodiment, the data stamp logic 124 maintains a data stamp table such as the data stamp table of FIG. 3, in a volatile, dynamic random access memory (DRAM) 132. When the storage device 103 is powered off or goes into a low power state, the data stamp logic 124 of the storage device 103 saves the data stamp information of the data stamp table of FIG. 3 to nonvolatile media (NVM) such as a portion of the bitcell array 105. After the storage device 103 powers up or exits a low power state, the data stamp logic 124 loads the data stamp information from the nonvolatile storage. In this manner, the data stamp information for each superblock entry of the data stamp table of FIG. 3 is preserved, notwithstanding that the storage device 103 may be intermittently in a powered off or in a low power state for a period of time.

In another aspect of demarcation voltage determination in accordance with the present description, the data stamp logic 124 is further configured to, in association with a read operation to be performed by a read logic 136 of the memory controller 107, obtain a read temperature value provided by a temperature sensor such as the temperature sensor 128 thermally coupled to the bitcell array 105. The data stamp logic 124 is further configured to store the read temperature value provided by the temperature sensor 128 as a stored temperature value to indicate the temperature of the storage elements of the bitcell array 105 at or about the time of the read operation.

In the illustrated embodiment, the data stamp logic 124 stores the read temperature value provided by the temperature sensor 128 in a table, such as the data stamp table of FIG. 3. As noted above, the first entry of the data stamp table is for the superblock S0 as indicated in the "Superblock" field of the data stamp table of FIG. 3. At the time data is to be read from the superblock S0 in the example of FIG. 3, the temperature sensor 128 indicates a read temperature of 25 degrees Celsius (C) in this example. Accordingly, in the entry for the superblock S0, the data stamp logic 124 stores the read temperature value 25 degrees C. in the "Read Temperature" field of the data stamp table of FIG. 3.

In another aspect of demarcation voltage determination in accordance with the present description, the data stamp logic 124 is further configured to, in connection with a read operation by the write logic 120, obtain a read clock value provided by a clock such as a system clock of the peripheral components 50 (FIG. 1) for example. The data stamp logic 124 is further configured to store the read clock value provided by the system clock as a stored read clock value to indicate when the read operation occurred.

In the illustrated embodiment, the data stamp logic 124 stores the read clock value provided by the system clock in a table, such as the data stamp table of FIG. 3, for example. For example, as noted above, the first entry of the data stamp table of FIG. 3 is for the superblock S0 as indicated in the "Superblock" field of the table of FIG. 3. At or about the time data is to be read from the superblockS0, the system clock indicates a read clock value of 687000 seconds in this example. Accordingly, the read operation directed to the superblock S0 occurs 87000 seconds (687000-600000) in this example, after the data was initially written to the superblock S0. Thus, in the entry for the superblock S0, the data stamp logic 124 stores the read clock value 687000 seconds in the "Read Timestamp" field of the superblock S0 entry of the data stamp table of FIG. 3.

In another aspect of demarcation voltage determination in accordance with the present description, the data stamp logic 124 is further configured to, in connection with a read operation by the write logic 120, to determine a data retention time value which is a function of the duration of time following the write operation on a superblock, to the read operation on that superblock of the bitcell array 105. In one example, the data retention time value is computed by the data stamp logic 124 for a particular superblock by subtracting the write timestamp value for a particular superblock from the read timestamp value for that superblock.

For example, in the first entry of the data stamp table of FIG. 3 which is for the superblock S0 as indicated in the "Superblock" field of the table of FIG. 3, data of the superblockS0 has a data retention time value of 87000 seconds (687000-600000) between the time the data was written to the superblockS0 and the time the data is to be read from the superblockS0. In the illustrated embodiment, the data retention time value is expressed in units of days rather than seconds. Accordingly, a data retention time value measured in seconds may be rounded off to the nearest number of days which is one day in this example. Thus, in the entry for the superblock S0, the data stamp logic 124 stores the data retention time value of one day in the "Data Retention Time" of the superblockS0 entry of the data stamp table of FIG. 3.

In another aspect of demarcation voltage determination in accordance with the present description, the read logic 136 further includes voltage demarcation logic 140 which is configured to determine a demarcation voltage to apply for performing the read operation on storage elements of the bitcell array 105 as a function of the stored temperature value of the prior write operation on the storage element, a determined temperature value of the read operation on the storage element and a data retention time value as a function of a duration of time following the write operation on the storage element, to the read operation on the storage element. As set forth above, these values may be obtained from the data stamp table of FIG. 3 which has these values for each superblock of the bitcell array 105.

Figure 5A:
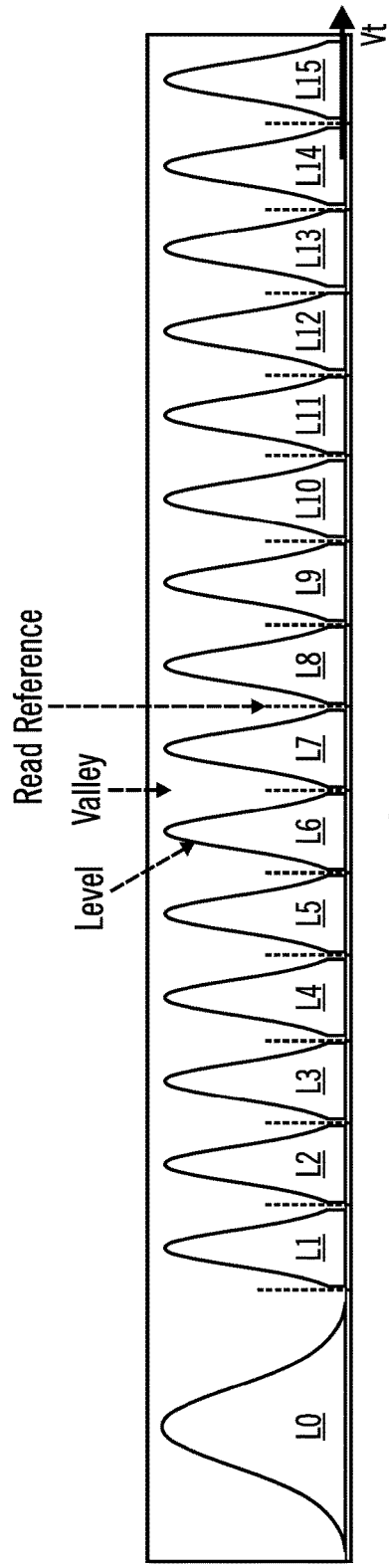
FIGS. 5A and 5B illustrate examples of quad-level cell programming Vt distributions.

FIG. 5A illustrates an example quad-level cell programming threshold voltage (Vt) distributions of a quad-level cell of the superblock S0 of the bit array 105 (FIG. 2). As a quad-level cell, the quad-cell programming Vt distributions include sixteen levels which may be designated levels L0-L15 (FIG. 6), each of which maintains an associated binary value as shown in the table of FIG. 6. Thus, the level L0 maintains the binary value "1111", the level L1 maintains the binary value "0111" etc., as depicted in the table of FIG. 6. In that the quad-level cell programming Vt distributions include sixteen levels, L0-L15, FIG. 5A also depicts fifteen valleys, each valley being between two adjacent levels. The fifteen valleys are designated valleys V0-V14 in the table of FIG. 6. Using the fifteen valleys between adjacent levels of the sixteen programming Vt distributions levels L0-L15, fifteen read reference values, also referred to as demarcation voltages, may be applied to distinguish between adjacent levels and to read stored binary values according to the quad-level cell programming distributions. The fifteen read reference values may be designated R000-R0111 as shown in the table of FIG. 6. As shown therein, the read reference R0111 distinguishes between levels L0 (binary value 1111) and L1 (binary value 0111), the read reference R0011 distinguished between levels L1 (binary value 0111) and L2 (binary value 0011) etc.

In another aspect of demarcation voltage determination in accordance with the present description, it is recognized that one or more of the quad-level cell programming Vt distributions L0-L15 may shift due to various factors such as a temperature differential between the write temperature at which the data was written to a superblock of data, and the read temperature at which the data is subsequently read from the superblock. Additional factors which may cause one or more of the quad-level cell programming Vt distributions L0-L15 to shift includes the data retention time between the time the data was written to the superblock, and the time of reading the data from the superblock.

Figure 5B:
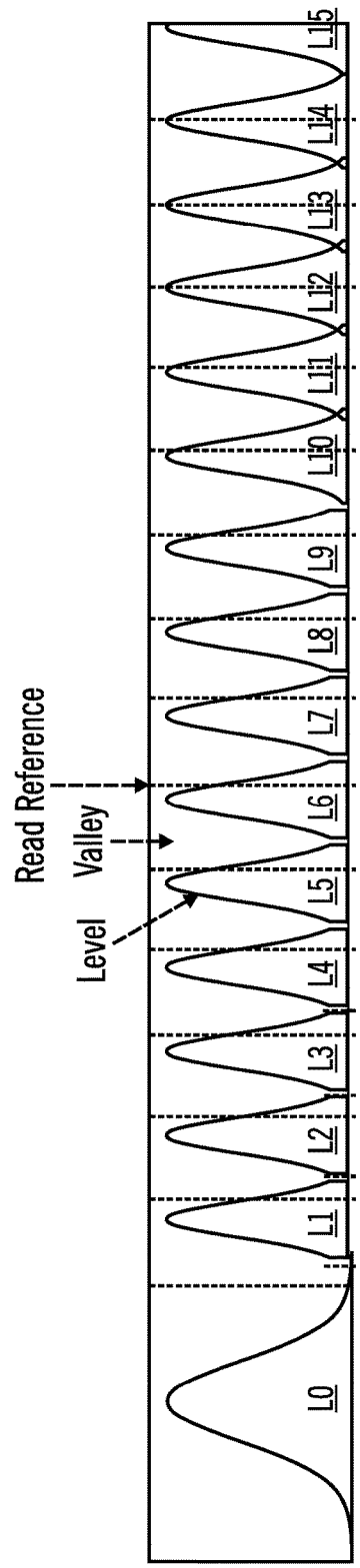

FIG. 5B shows one example in which the quad-level cell programming Vt distributions L0-L15 have all shifted with respect to the quad-level cell programming Vt distributions L0-L15 for a QLC storage element of the superblock S3. In the example of FIG. 5A, the storage data stamp table of FIG. 3 indicates that storage elements of the superblock S0 were programmed at a relatively low temperature such as 25 degrees C., for example, and were read at substantially the same temperature, such as 25 degrees C., for example. By comparison, in the example of FIG. 5B, the storage data stamp table of FIG. 3 indicates that storage elements of the superblock S3 were programmed at a relatively low temperature such as 25 degrees C., for example, and were read at a substantially higher temperature, such as 70 degrees C., for example.

It is appreciated herein that programming a storage element at a low temperature and reading the programmed storage element at a high temperature tends to cause a widening of Vt distributions and to shift the voltages of the Vt distributions to higher values that is to the right in the graph of FIG. 5B. By comparison, programming a storage element at a high temperature and reading the programmed storage element at a low temperature also tends to cause a widening of Vt distributions but tends to shift the voltages of the Vt distributions to lower values, that is to the left in a graph in which the voltage Vt axis increases to the right.

In order to compensate for the shift and widening of the Vt distributions where the storage element were programmed at one temperature but were read at a substantially different temperature, the read references R000-R0111 (FIG. 6) may be shifted as well. For example, FIG. 7A depicts quad-level cell programming Vt distributions L0 and L1 of FIG. 5A with read reference R0111 positioned to distinguish between distributions L0 and L1, quad-level cell programming Vt distributions L1 and L2 with read reference R0011 positioned to distinguish between distributions L1 and L2, and quad-level cell programming Vt distributions L2 and L3 with read reference R1011 positioned to distinguish between distributions L0 and L1. However because the storage element was programmed at a low temperature and read at a high temperature, the quad-level cell programming Vt distributions L0-L3 have widened and shifted to the right as depicted in FIG. 7B with respect to the read references R0111, R0011, and R1011, respectively of FIGS. 7A and 7B. Accordingly, the read references R0111, R0011, and R1011 if left unchanged, can lead to errors when reading data from the superblock.

In accordance with one aspect of demarcation voltage determination in accordance with the present description, the read references or demarcation voltages used to distinguish the various levels of quad-level cell programming, may be adjusted to improve accuracy of read operations directed to the superblock. More specifically, in one embodiment, the read logic 136 (FIG. 2) includes voltage demarcation logic 140 which is configured to adjust demarcation voltages to be applied in performing the read operation on storage elements of the bitcell array 105 as a function of a stored temperature value of the prior write operation on the storage element, a determined temperature value of the read operation for the storage element, and a data retention time value as a function of a duration of time following the write operation on the storage element, to the read operation for the storage element. As set forth above, these values may be obtained from the data stamp table of FIG. 3 which has stored these values for each superblock of the bitcell array 105 containing write data.

In one embodiment, the voltage demarcation logic 140 maintains a look-up table in which adjustment factors, referred to herein as moving read reference (MRR) adjustment factors may be looked up to adjust read references, that is, demarcation voltages to be applied in performing the read operation on storage elements of the bitcell array 105. FIG. 8 depicts an example of such a look-up table having n entries, LTE1, LTE2 . . . LTEn, in which MRR adjustment factors may be looked up as a function of the word line type of storage elements of a superblock, a stored temperature value of the prior write operation on a superblock of storage elements, a determined temperature value for a subsequent read operation on the superblock of storage elements, and a data retention time value as a function of a duration of time following the write operation on the superblock of storage elements, to the read operation on the superblock of storage elements. Each look-up table entry, LTE1, LTE2 . . . LTEn, has a range of write temperatures, a range of read temperatures and a range of retention times, associated with an MRR option, Option_1, Option_2, . . . Option_n which defines one or more MRR adjustment factors to be applied to adjust read reference voltages in performing a read operation on storage elements of the bitcell array 105.

In one embodiment, each option Option_1, Option_2, . . . Option_n may provide a single common MRR adjustment factor such a single incremental value to be added to each read reference for the Vt distribution, or a single decremental value to be subtracted from each read reference for the Vt distribution, depending upon the amount of shift of the quad-level cell programming Vt distributions L0, L1 . . . L15 and the direction of the shift. A single common MRR adjustment factor may be particularly suited to shifts which affect each programming Vt distributions L0, L1 . . . L15 in a relatively uniform manner. Examples of incremental MRR adjustment factors include +20 mV, +40 mV, +50 mV, etc to be added to each read reference for a set of Vt distributions L0, L1 . . . L15, and examples of decremental MRR adjustment factors include −20 mV, −40 mV, −50 mV, etc., for example, to decrement each read reference for a set of Vt distributions L0, L1 . . . L15. An incremental or decremental MRR adjustment factor may be selected for a particular option, depending upon the amount of shift of the quad-level cell programming Vt distributions L0, L1 . . . L15 and the direction of the shift.

In other embodiments, one or more of the options Option_1, Option_2, . . . Option_n may include multiple MRR adjustment factors to be applied to multiple individual read references for a set of Vt distributions L0, L1 . . . L15. FIG. 9 depicts a table indicating for each of the read references, R000-R111 of a set of Vt distributions, associated MRR adjustment factor M000-M111, respectively, which may individually adjust the associated read reference up or down to compensate for a non-uniform shift of Vt distributions L0, L1 . . . L15.

FIG. 7B shows an example of a portion of the quad-level cell programming Vt distribution of FIG. 5B, that is, quad-level cell programming Vt distributions L0-L3, together with an MRR adjustment factor which adjusts the read references to compensate for the fact that the storage element was programmed at a low temperature and read at a high temperature. In this example, the differential between the programming and read temperatures caused the quad-level cell programming Vt distributions L0-L3 to have widened and shifted to the right as depicted in FIG. 7B with respect to initial read references R0111, R0011, and R1011, respectively of FIGS. 7A and 7B. Accordingly, the initial read references R0111, R0011, and R1011 have been adjusted by a common MRR adjustment factor, a positive incremental voltage in this example, to yield adjusted read references R0111', R0011', and R1011' as shown in FIG. 7B, to improve the accuracy of the read operation. As shown in FIG. 7B, the adjusted read reference R0111' distinguishes between levels L0 (binary value 1111) and L1 (binary value 0111), the adjusted read reference R0011' distinguishes between levels L1 (binary value 0111) and L2 (binary value 0011), the adjusted read reference R1011' distinguishes between levels L2 (binary value 0011) and L3 (binary value 1011), By comparison, the storage element of FIGS. 5A and 7A was programmed at a low temperature such as 25 degrees C., for example, and read at the same low temperature 25 degrees C. As a result, the quad-level cell programming Vt distributions have not widened nor shifted to the right with respect to the read references of FIGS. 5A and 7A. Hence the read operation read at the same low temperature 25 degrees C. as the programming (write) operation at 25 degrees C. may not require any adjustment to the read references for an accurate read.

The voltage demarcation logic 140 is configured to look-up a value for the MRR adjustment factor of FIG. 7B in the MRR Adjustment Factor look-up table of FIG. 8. As previously mentioned, FIG. 8 depicts an example of such a look-up table in which MRR adjustment factors may be looked up as a function of the word line type of storage elements of a superblock, a stored temperature value of the prior write operation on a superblock of storage elements, a determined temperature value for a subsequent read operation on the superblock of storage elements, and a data retention time value as a function of a duration of time following the write operation on the superblock of storage elements, to the read operation on the superblock of storage elements. In the example of FIG. 7B, the storage element was programmed at 25 degrees C. two weeks prior to the read operation and the current bitcell array temperature at which the read operation is to be performed is 70 degrees C.

The voltage demarcation logic 140 is configured to identify the look-up table entry of FIG. 8 having the closest match to these write temperature, read temperature and retention time conditions for a storage element having a QLC word line type. Word line type logic 150 (FIG. 2) of the memory controller 107 identifies the word line type of each superblock of the bitcell array 105 in those embodiments having more than one word line type. An inspection of the look-up table of FIG. 8 and comparison of the entries of the look-up table to the write temperature, read temperature and retention time conditions and world line type of the superblock S3 reveals that look-up table entry LTE5 in this example has the closest match. More specifically, the programming temperature for the distributions of a storage element of superblock S3 as shown in FIGS. 5B, 7B was 25 degrees C. which satisfies the <45 degrees C. range entry of the write temperature field of table entry LTE5, the read temperature of the distribution of FIG. 7B is 70 degrees C. which satisfies the >45 degrees C. range entry of the read temperature field of table entry LTE5, the data retention time of two weeks of the distribution of FIG. 7B satisfies the >1 week range entry of the data retention time field of table entry LTE5 and the storage element of FIG. 7B is a QLC type. Hence, the table entry of the look-up table of FIG. 8 having the range entries which mostly closely match the values of the write temperature, read temperature, retention time and storage element word line type of FIG. 7B is the table entry LTE5.

Accordingly, in the example of FIG. 7B, the voltage demarcation logic 140 identifies the look-up table entry LTE5 of FIG. 8 as having the closest match to these write temperature, read temperature and retention time conditions for a storage element having a QLC word line type. Thus, the associated MRR adjustment factor option_7 of the entry LTE5 is selected. In this example, the MRR adjustment factor option_7 defines a positive incremental voltage as the MRR adjustment factor which adjusts the read references to compensate for the rightward shift and widening of the quad-level cell programming Vt distributions of FIG. 7B to improve read accuracy.

Figures 10, 11:
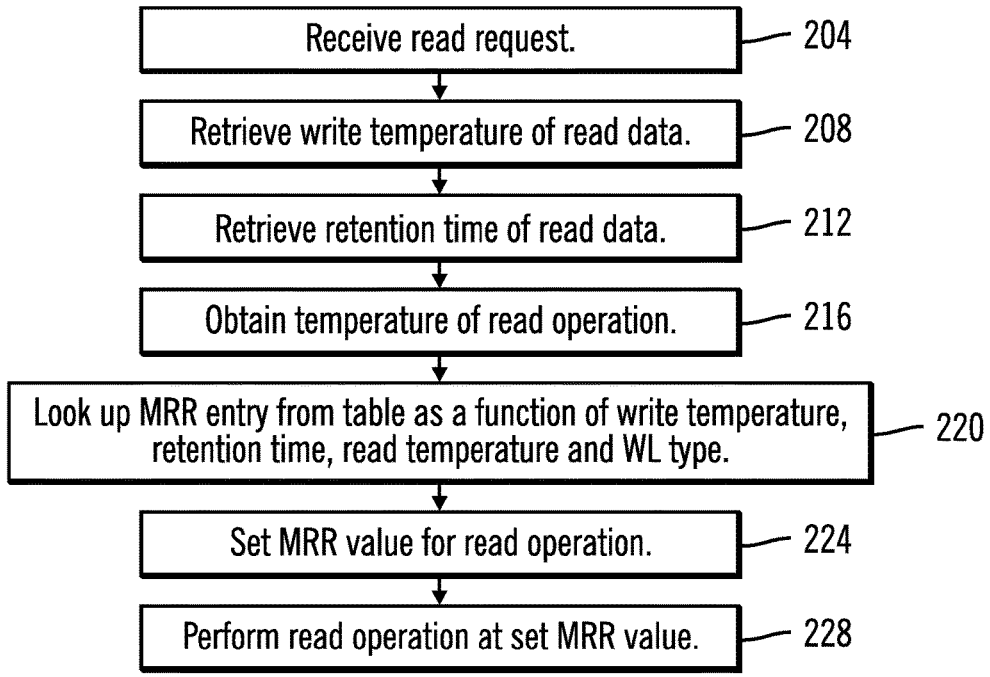
FIG. 10 depicts an example of operations of a memory performing a read operation employing demarcation voltage determination in accordance with the present description.
FIG. 11 depicts an example of subdivisions within a superblock of storage elements.

FIG. 10 depicts one example of a read operation by the memory 103 (FIG. 2) employing demarcation voltage determination in accordance with the present description. In this example, the read operation is directed to data stored in storage elements having a QLC word line type in superblock S3. In response to the read request, the voltage demarcation logic 140 of the read logic 136 retrieves (block 208) the write temperature data from a data stamp table such as the data stamp table of FIG. 3. In this example, following receipt (block 204, FIG. 10) of a read request, errors may have been encountered which could not be corrected utilizing error correction codes. As a result, the demarcation logic 140 was invoked to adjust the read reference voltages to compensate for possible distribution shifts and widening which may have caused the read errors.

In alternative embodiments, the demarcation logic 140 employing demarcation voltage determination in accordance with the present description may be triggered or responsive to every time before a read, or every time when a block is read the first time after power-up, or every time when a block is read after too many read errors are detected indicating cross temperature or retention issues as indicated above. It is appreciated that other types of events may trigger use of the demarcation logic 140, depending upon the particular application.

Because the read operation is directed to data stored in superblock S3, the voltage demarcation logic 140 of the read logic 136 retrieves (block 208) from the data stamp table entry for superblock S3 of FIG. 3, the write temperature value of 25 degrees C. indicating the temperature at which the data was written to the superblock S3. In addition, the voltage demarcation logic 140 of the read logic 136 retrieves (block 212) the data retention time value of 14 days (two weeks) from the data stamp table entry for superblock S3 indicating that 14 days have passed since the data was written. Still further, the voltage demarcation logic 140 retrieves (block 216) from the data stamp table entry for superblock S3 of FIG. 3, the read temperature value of 70 degrees C. indicating the temperature at which the data is to be read from the superblock S3 It is appreciated that in other embodiments, the temperature at which the current read operation is to be performed may be obtained in real time directly from a temperature sensor instead of indirectly through a table entry, for example.

Using the retrieved write temperature, read temperature and retention time conditions for a storage element having a QLC word line type, the voltage demarcation logic 140 identifies (block 220, FIG. 10) the look-up table entry of FIG. 8 having the closest match to these write temperature, read temperature and retention time conditions for a storage element having a QLC word line type. As described above, an inspection of the look-up table of FIG. 8 and comparison of the range entries of the look-up table to the write temperature, read temperature and retention time condition values and world line type reveals that look-up table entry LTE5 in this example has the closest match.

Having identified the look-up table entry LTE5 of FIG. 8 as having the closest match to these write temperature, read temperature and retention time conditions for a storage element having a QLC word line type, the demarcation logic sets (block 224) the MRR adjustment factor option_7 of the entry LTE5 to adjust the read reference voltages of the storage elements for the read operation directed to those storage elements. In this example, the MRR adjustment factor option_7 defines a positive incremental voltage as the MRR adjustment factor which adjusts the read references to compensate for the rightward shift and widening of the quad-level cell programming Vt distributions (FIG. 5B) to improve read accuracy as shown for the distributions L0, L1 and L2 in FIG. 7B.

Having adjusted the read reference voltages for reading the storage elements of the superblock S3, the read logic 136 performs (block 228, FIG. 10) the read operation with read reference voltages adjusted by the MRR adjustment factor or factors of option_7. As a result, read accuracy and success rate for those storage elements may be improved notwithstanding shifting or widening of quad-level cell programming Vt distributions due to cross temperature and/or data retention time issues affecting the read operation. Thus, read latency times may be reduced, providing significant improvement to computer technology.

Although an example of demarcation voltage determination in accordance with the present description has been described in connection with a quad-level cell (QLC) having 16 levels to store four bits, it is appreciated that demarcation voltage determination in accordance with the present description may be applied to other types of cells including single level cells (SLC) capable of storing one bit, multi-level cells (MLC) capable of storing two bits, triple level cells (TLC) capable of storing three bits, etc.

As described above, the data stamp table of FIG. 3 has an entry for each superblock of the bitcell array 105. However, it is appreciated that other subdivisions of the bitcell array 105 may be utilized to increase the granularity for entries in a data stamp table of a memory employing demarcation voltage determination in accordance with the present description. For example, superblock S0 includes a block 0 in each plane of each die. FIG. 11 depicts one example of one such block 0 of superblock S0 in which that block 0 is subdivided into 768 pages, PAGE0, PAGE1 . . . PAGE767. In this example, pages PAGE0-PAGE3 of the block 0 share word line WL0, pages PAGE4-PAGE7 share word line WL1, etc. Accordingly, the data stamp table of FIG. 3 may be expanded to have an entry for each page, for example, of each superblock of the bitcell array 105. FIG. 12 depicts an example of one such entry for a page, PAGE0 in this example, of superblock S0. The data stamp table of FIG. 12 has added granularity fields "Block", Word Line", and "Page" as indicated in FIG. 12. Thus, in a write operation directed to a group of storage elements such as a page, for example, the stored temperature value for that page as identified by superblock, block, word line and page, indicates a temperature of the write operation on the page of storage elements and the stored time value indicates a time of the write operation on the page of storage elements. As noted above, it is appreciated that a group of storage elements of the write operation and the granularity of the data stamp table may be defined by a page, group of word lines, word line, sub-block, block, partial (open) superblock, full (closed) superblock or other granularity, depending upon the particular application.

One or more of the tables described herein may be stored in dynamic memory and transferred to non-volatile memory in power down or low power conditions. In other embodiments, data of the tables may be stored in spare bytes of the non-volatile memory. Such spare bytes frequently employ a more robust ECC scheme as compared to main bytes of the non-volatile memory.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Drives (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is an apparatus for use with a bitcell array of non-volatile storage elements and a temperature sensor, comprising: a memory controller configured to control memory read and memory write operations directed to the bitcell array of non-volatile storage elements, wherein the temperature sensor is configured to provide temperature values indicative of temperatures of memory read and write operations, and wherein the memory controller includes: data stamp logic configured to, in response to a memory write operation for writing data on a storage element in the bitcell array of non-volatile storage elements, store a temperature value provided by the temperature sensor as a stored temperature value to indicate a temperature of the write operation on the storage element, and voltage demarcation logic configured to, in response to receiving a request to perform a read operation to read the data written by the write operation on the storage element, determine a demarcation voltage to apply for performing the read operation on the storage element, as a function of the stored temperature value at which the write operation occurred on the storage element.

In Example 2, the subject matter of Examples 1-9 (excluding the present Example) can optionally include wherein the data stamp logic is further configured to, in response to receiving the request to perform the read operation to read the data written by the write operation on the storage element, determine a read temperature value provided by the temperature sensor, which read temperature value indicates a temperature of the read operation on the storage element, and wherein the voltage demarcation logic is configured to determine the demarcation voltage to apply for performing the read operation on the storage element, as a function of both the stored temperature value at which the write operation occurred on the storage element and the determined read temperature value of the read operation on the storage element.

In Example 3, the subject matter of Examples 1-9 (excluding the present Example) can optionally include a clock configured to indicate a time of the write operation on the storage element, wherein the data stamp logic is further configured to, in response to the write operation on the storage element, store a time value provided by the clock to indicate a time of the write operation on the storage element, and wherein the voltage demarcation logic is configured to determine a demarcation voltage to apply for performing the read operation on the storage element, as a function of the stored temperature value of the write operation on the storage element, the determined read temperature value of the read operation on the storage element and a data retention time value as a function of a duration of time following the write operation on the storage element, to the read operation on the storage element.

In Example 4, the subject matter of Examples 1-9 (excluding the present Example) can optionally include wherein the memory controller is configured to direct the write operation to the storage element to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

In Example 5, the subject matter of Examples 1-9 (excluding the present Example) can optionally include wherein the memory controller further includes word line type logic configured to identify the word line type of the storage element to which the read operation is directed, and wherein the voltage demarcation logic is configured to determine a demarcation voltage to apply for performing the read operation on the storage element, as a function of a word line type of the storage element to which the read operation is directed, the stored temperature value of the write operation on the storage element, the determined read temperature value of the read operation on the storage element and the data retention time value.

In Example 6, the subject matter of Examples 1-9 (excluding the present Example) can optionally include wherein the voltage demarcation logic is configured to determine a demarcation voltage to apply for performing the read operation on the storage element, prior to each read operation directed to the storage element.

In Example 7, the subject matter of Examples 1-9 (excluding the present Example) can optionally include wherein the voltage demarcation logic is configured to determine a demarcation voltage to apply for performing the read operation on the storage element, prior to a first read operation directed to the storage element following a power-up of the memory controller.

In Example 8, the subject matter of Examples 1-9 (excluding the present Example) can optionally include wherein the memory controller is configured to detect a plurality of failures to successfully read data in a plurality of read operations directed to the storage element and wherein the voltage demarcation logic is configured to determine a demarcation voltage to apply for performing a read operation on the storage element, in response to detection of a plurality of failures to successfully read data in a plurality of read operations directed to the storage element.

In Example 9, the subject matter of Examples 1-9 (excluding the present Example) can optionally include a system, said system comprising: a central processing unit, said memory component, and at least one of a display communicatively coupled to the processor, a network interface communicatively coupled to the central processing unit, and a battery coupled to provide power to the system.

Example 10 is a method comprising, in response to a write operation for writing data on a storage element in a non-volatile memory device, storing a temperature value provided by a temperature sensor as a stored temperature value to indicate a temperature of the write operation on the storage element, and in response to receiving a request to perform a read operation to read the data written by the write operation on the storage element, determining a demarcation voltage to apply for performing the read operation on the storage element, as a function of the stored temperature value at which the write operation occurred on the storage element.

In Example 11, the subject matter of Examples 10-18 (excluding the present Example) can optionally include, further in response to receiving the request to perform the read operation to read the data written by the write operation on the storage element, determining a read temperature value provided by a temperature sensor, which read temperature value indicates a temperature of the read operation on the storage element, wherein the determining the demarcation voltage to apply for performing the read operation on the storage element, is a function of both the stored temperature value at which the write operation occurred on the storage element and the determined read temperature value of the read operation on the storage element.

In Example 12, the subject matter of Examples 10-18 (excluding the present Example) can optionally include, further in response to the write operation on a storage element in a non-volatile memory device, storing a time value provided by a clock to indicate a time of the write operation on the storage element, and wherein the determining a demarcation voltage to apply for performing the read operation on the storage element, is a function of the stored temperature value of the write operation on the storage element, the determined read temperature value of the read operation on the storage element and a data retention time value as a function of a duration of time following the write operation on the storage element, to the read operation on the storage element.

In Example 13, the subject matter of Examples 10-18 (excluding the present Example) can optionally include wherein the write operation to the storage element is directed to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

In Example 14, the subject matter of Examples 10-18 (excluding the present Example) can optionally include, wherein the determining a demarcation voltage to apply for performing the read operation on the storage element, is a function of a word line type of the storage element to which the read operation is directed, the stored temperature value of the write operation on the storage element, the determined read temperature value of the read operation on the storage element and the data retention time value.

In Example 15, the subject matter of Examples 10-18 (excluding the present Example) can optionally include wherein the determining a demarcation voltage to apply for performing the read operation on the storage element, is performed prior to each read operation directed to the storage element.

In Example 16, the subject matter of Examples 10-18 (excluding the present Example) can optionally include wherein the determining a demarcation voltage to apply for performing the read operation on the storage element, is performed prior to a first read operation directed to the storage element following a power-up of the non-volatile memory device.

In Example 17, the subject matter of Examples 10-18 (excluding the present Example) can optionally include detecting a plurality of failures to successfully read data in a plurality of read operations directed to the storage element and wherein the determining a demarcation voltage to apply for performing a read operation on the storage element, is performed in response to detection of a plurality of failures to successfully read data in a plurality of read operations directed to the storage element.

Example 18 is an apparatus comprising means to perform a method as claimed in any preceding claim.

Example 19 is a system, comprising: a central processing unit, a memory component, the memory component including a bitcell array of non-volatile storage elements and a memory controller configured to control memory read and memory write operations directed to the bitcell array of non-volatile storage elements, and a temperature sensor configured to provide a temperature values indicative of memory read and write operations, wherein the memory controller includes: data stamp logic configured to, in response to a memory write operation for writing data on a storage element in the bitcell array of non-volatile storage elements, store a temperature value provided by the temperature sensor as a stored temperature value to indicate a temperature of the write operation on the storage element, and voltage demarcation logic configured to, in response to receiving a request to perform a read operation to read the data written by the write operation on the storage element, determine a demarcation voltage to apply for performing the read operation on the storage element, as a function of the stored temperature value at which the write operation occurred on the storage element.

In Example 20, the subject matter of Examples 19-28 (excluding the present Example) can optionally include, wherein the data stamp logic is further configured to, in response to receiving the request to perform the read operation to read the data written by the write operation on the storage element, determine a read temperature value provided by the temperature sensor, which read temperature value indicates a temperature of the read operation on the storage element, and wherein the voltage demarcation logic is configured to determine the demarcation voltage to apply for performing the read operation on the storage element, as a function of both the stored temperature value at which the write operation occurred on the storage element and the determined read temperature value of the read operation on the storage element.

In Example 21, the subject matter of Examples 19-28 (excluding the present Example) can optionally include a clock configured to indicate a time of the write operation on the storage element, wherein the data stamp logic is further configured to, in response to the write operation on the storage element, store a time value provided by the clock to indicate a time of the write operation on the storage element, and wherein the voltage demarcation logic is configured to determine a demarcation voltage to apply for performing the read operation on the storage element, as a function of the stored temperature value of the write operation on the storage element, the determined read temperature value of the read operation on the storage element and a data retention time value as a function of a duration of time following the write operation on the storage element, to the read operation on the storage element.

In Example 22, the subject matter of Examples 19-28 (excluding the present Example) can optionally include wherein the memory controller is configured to direct the write operation to the storage element to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

In Example 23, the subject matter of Examples 19-28 (excluding the present Example) can optionally include, wherein the memory controller further includes word line type logic configured to identify the word line type of the storage element to which the read operation is directed, and wherein the voltage demarcation logic is configured to determine a demarcation voltage to apply for performing the read operation on the storage element, as a function of a word line type of the storage element to which the read operation is directed, the stored temperature value of the write operation on the storage element, the determined read temperature value of the read operation on the storage element and the data retention time value.

In Example 24, the subject matter of Examples 19-28 (excluding the present Example) can optionally include wherein the voltage demarcation logic is configured to determine a demarcation voltage to apply for performing the read operation on the storage element, prior to each read operation directed to the storage element.

In Example 25, the subject matter of Examples 19-28 (excluding the present Example) can optionally include wherein the voltage demarcation logic is configured to determine a demarcation voltage to apply for performing the read operation on the storage element, prior to a first read operation directed to the storage element following a power-up of the memory component.

In Example 26, the subject matter of Examples 19-28 (excluding the present Example) can optionally include wherein the memory controller is configured to detect a plurality of failures to successfully read data in a plurality of read operations directed to the storage element and wherein the voltage demarcation logic is configured to determine a demarcation voltage to apply for performing a read operation on the storage element, in response to detection of a plurality of failures to successfully read data in a plurality of read operations directed to the storage element.

In Example 27, the subject matter of Examples 19-28 (excluding the present Example) can optionally include at least one of: a display communicatively coupled to the central processing unit, a network interface communicatively coupled to the central processing unit, and a battery coupled to provide power to the system.

In Example 28, the subject matter of Examples 19-28 (excluding the present Example) can optionally include at least one of: a display communicatively coupled to the central processing unit, a network interface communicatively coupled to the central processing unit, and a battery coupled to provide power to the system.

Example 29 is an apparatus, for use with a bitcell array of non-volatile storage elements and a temperature sensor, the apparatus comprising a memory controller configured to control memory read and memory write operations directed to the bitcell array of non-volatile storage elements, wherein the temperature sensor is configured to provide temperature values indicative of temperatures of memory read and write operations, and wherein the memory controller includes: data stamp logic means configured for, in response to a memory write operation for writing data on a storage element in the bitcell array of non-volatile storage elements, storing a temperature value provided by the temperature sensor as a stored temperature value to indicate a temperature of the write operation on the storage element, and voltage demarcation logic means configured for, in response to receiving a request to perform a read operation to read the data written by the write operation on the storage element, determining a demarcation voltage to apply for performing the read operation on the storage element, as a function of the stored temperature value at which the write operation occurred on the storage element.

In Example 30, the subject matter of Examples 29-37 (excluding the present Example) can optionally include, wherein the data stamp logic means is further configured for, in response to receiving the request to perform the read operation to read the data written by the write operation on the storage element, determining a read temperature value provided by the temperature sensor, which read temperature value indicates a temperature of the read operation on the storage element, and wherein the voltage demarcation logic means is configured for determining the demarcation voltage to apply for performing the read operation on the storage element, as a function of both the stored temperature value at which the write operation occurred on the storage element and the determined read temperature value of the read operation on the storage element.

In Example 31, the subject matter of Examples 29-37 (excluding the present Example) can optionally include a clock configured to indicate a time of the write operation on the storage element, wherein the data stamp logic means is further configured for, in response to the write operation on the storage element, storing a time value provided by the clock to indicate a time of the write operation on the storage element, and wherein the voltage demarcation logic means is configured for determining a demarcation voltage to apply for performing the read operation on the storage element, as a function of the stored temperature value of the write operation on the storage element, the determined read temperature value of the read operation on the storage element and a data retention time value as a function of a duration of time following the write operation on the storage element, to the read operation on the storage element.

In Example 32, the subject matter of Examples 29-37 (excluding the present Example) can optionally include wherein the memory controller is configured for directing the write operation to the storage element to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

In Example 33, the subject matter of Examples 29-37 (excluding the present Example) can optionally include, wherein the memory controller further includes word line type logic means configured for identifying the word line type of the storage element to which the read operation is directed, and wherein the voltage demarcation logic means is configured for determining a demarcation voltage to apply for performing the read operation on the storage element, as a function of a word line type of the storage element to which the read operation is directed, the stored temperature value of the write operation on the storage element, the determined read temperature value of the read operation on the storage element and the data retention time value.

In Example 34, the subject matter of Examples 29-37 (excluding the present Example) can optionally include wherein the voltage demarcation logic means is configured for determining a demarcation voltage to apply for performing the read operation on the storage element, prior to each read operation directed to the storage element.

In Example 35, the subject matter of Examples 29-37 (excluding the present Example) can optionally include wherein the voltage demarcation logic means is configured for determining a demarcation voltage to apply for performing the read operation on the storage element, prior to a first read operation directed to the storage element following a power-up of the memory controller.

In Example 36, the subject matter of Examples 29-37 (excluding the present Example) can optionally include wherein the memory controller is configured for detecting a plurality of failures to successfully read data in a plurality of read operations directed to the storage element and wherein the voltage demarcation logic means is configured for determining a demarcation voltage to apply for performing a read operation on the storage element, in response to detection of a plurality of failures to successfully read data in a plurality of read operations directed to the storage element.

In Example 37, the subject matter of Examples 29-37 (excluding the present Example) can optionally include a system, said system comprising: a central processing unit, said memory component, and at least one of a display communicatively coupled to the processor, a network interface communicatively coupled to the central processing unit, and a battery coupled to provide power to the system.

Example 38 is a computer program product for a computing system wherein the computer program product comprises a computer readable storage medium having program instructions embodied therewith, the program instructions executable by a processor of the computing system to cause operations, the operations comprising: in response to a write operation for writing data on a storage element in a non-volatile memory device, storing a temperature value provided by a temperature sensor as a stored temperature value to indicate a temperature of the write operation on the storage element, and in response to receiving a request to perform a read operation to read the data written by the write operation on the storage element, determining a demarcation voltage to apply for performing the read operation on the storage element, as a function of the stored temperature value at which the write operation occurred on the storage element.

In Example 39, the subject matter of Examples 38-45 (excluding the present Example) can optionally include wherein the operations further comprise: further in response to receiving the request to perform the read operation to read the data written by the write operation on the storage element, determining a read temperature value provided by a temperature sensor, which read temperature value indicates a temperature of the read operation on the storage element, wherein the determining the demarcation voltage to apply for performing the read operation on the storage element, is a function of both the stored temperature value at which the write operation occurred on the storage element and the determined read temperature value of the read operation on the storage element.

In Example 40, the subject matter of Examples 38-45 (excluding the present Example) can optionally include, wherein the operations further comprise, further in response to the write operation on a storage element in a non-volatile memory device, storing a time value provided by a clock to indicate a time of the write operation on the storage element, and wherein the determining a demarcation voltage to apply for performing the read operation on the storage element, is a function of the stored temperature value of the write operation on the storage element, the determined read temperature value of the read operation on the storage element and a data retention time value as a function of a duration of time following the write operation on the storage element, to the read operation on the storage element.

In Example 41, the subject matter of Examples 38-45 (excluding the present Example) can optionally include wherein the write operation to the storage element is directed to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

In Example 42, the subject matter of Examples 38-45 (excluding the present Example) can optionally include, wherein the determining a demarcation voltage to apply for performing the read operation on the storage element, is a function of a word line type of the storage element to which the read operation is directed, the stored temperature value of the write operation on the storage element, the determined read temperature value of the read operation on the storage element and the data retention time value.

In Example 43, the subject matter of Examples 38-45 (excluding the present Example) can optionally include wherein the determining a demarcation voltage to apply for performing the read operation on the storage element, is performed prior to each read operation directed to the storage element.

In Example 44, the subject matter of Examples 38-45 (excluding the present Example) can optionally include wherein the determining a demarcation voltage to apply for performing the read operation on the storage element, is performed prior to a first read operation directed to the storage element following a power-up of the non-volatile memory device.

In Example 45, the subject matter of Examples 38-45 (excluding the present Example) can optionally include wherein the operations further comprise detecting a plurality of failures to successfully read data in a plurality of read operations directed to the storage element and wherein the determining a demarcation voltage to apply for performing a read operation on the storage element, is performed in response to detection of a plurality of failures to successfully read data in a plurality of read operations directed to the storage element.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:

1. An apparatus for use with a bitcell array of non-volatile storage elements and a temperature sensor, comprising:
   a memory controller configured to control memory read and memory write operations directed to the bitcell array of non-volatile storage elements, wherein the temperature sensor is configured to provide temperature values indicative of temperatures of memory read and write operations, and wherein the memory controller includes:
      data stamp logic configured to, in response to a memory write operation for writing data on a storage element in the bitcell array of non-volatile storage elements, store a temperature value provided by the temperature sensor as a stored temperature value to indicate a temperature of the write operation on the storage element; and
      voltage demarcation logic configured to, in response to receiving a request to perform a read operation to read the data written by the write operation on the storage element, determine a demarcation voltage to apply for performing the read operation on the storage element, as a function of the stored temperature value at which the write operation occurred on the storage element.

2. The apparatus of claim 1, wherein the data stamp logic is further configured to, in response to receiving the request to perform the read operation to read the data written by the write operation on the storage element, determine a read temperature value provided by the temperature sensor, which read temperature value indicates a temperature of the read operation on the storage element, and wherein the voltage demarcation logic is configured to determine the demarcation voltage to apply for performing the read operation on the storage element, as a function of both the stored temperature value at which the write operation occurred on the storage element and the determined read temperature value of the read operation on the storage element.

3. The apparatus of claim 2 further comprising a clock configured to indicate a time of the write operation on the storage element, wherein the data stamp logic is further configured to, in response to the write operation on the storage element, store a time value provided by the clock to indicate a time of the write operation on the storage element; and wherein the voltage demarcation logic is configured to determine a demarcation voltage to apply for performing the read operation on the storage element, as a function of the stored temperature value of the write operation on the storage element, the determined read temperature value of the read operation on the storage element and a data retention time value as a function of a duration of time following the write operation on the storage element, to the read operation on the storage element.

4. The apparatus of claim 3 wherein the memory controller is configured to direct the write operation to the storage element to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

5. The apparatus of claim 3, wherein the memory controller further includes word line type logic configured to identify the word line type of the storage element to which the read operation is directed, and wherein the voltage demarcation logic is configured to determine a demarcation voltage to apply for performing the read operation on the storage element, as a function of a word line type of the storage element to which the read operation is directed, the stored temperature value of the write operation on the storage element, the determined read temperature value of the read operation on the storage element and the data retention time value.

6. The apparatus of claim 1 wherein the voltage demarcation logic is configured to determine a demarcation voltage to apply for performing the read operation on the storage element, prior to each read operation directed to the storage element.

7. The apparatus of claim 1 wherein the voltage demarcation logic is configured to determine a demarcation voltage to apply for performing the read operation on the storage element, prior to a first read operation directed to the storage element following a power-up of the memory controller.

8. The apparatus of claim 1 wherein the memory controller is configured to detect a plurality of failures to successfully read data in a plurality of read operations directed to the storage element and wherein the voltage demarcation logic is configured to determine a demarcation voltage to apply for performing a read operation on the storage element, in response to detection of a plurality of failures to successfully read data in a plurality of read operations directed to the storage element.

9. A method comprising,
in response to a write operation for writing data on a storage element in a non-volatile memory device, storing a temperature value provided by a temperature sensor as a stored temperature value to indicate a temperature of the write operation on the storage element; and
in response to receiving a request to perform a read operation to read the data written by the write operation on the storage element, determining a demarcation voltage to apply for performing the read operation on the storage element, as a function of the stored temperature value at which the write operation occurred on the storage element.

10. The method of claim 9 further comprising:
further in response to receiving the request to perform the read operation to read the data written by the write operation on the storage element, determining a read temperature value provided by a temperature sensor, which read temperature value indicates a temperature of the read operation on the storage element, wherein the determining the demarcation voltage to apply for performing the read operation on the storage element, is a function of both the stored temperature value at which the write operation occurred on the storage element and the determined read temperature value of the read operation on the storage element.

11. The method of claim 10, further comprising, further in response to the write operation on a storage element in a non-volatile memory device, storing a time value provided by a clock to indicate a time of the write operation on the storage element; and wherein the determining a demarcation voltage to apply for performing the read operation on the storage element, is a function of the stored temperature value of the write operation on the storage element, the determined read temperature value of the read operation on the storage element and a data retention time value as a function of a duration of time following the write operation on the storage element, to the read operation on the storage element.

12. The method of claim 11 wherein the write operation to the storage element is directed to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

13. The method of claim 11, wherein the determining a demarcation voltage to apply for performing the read operation on the storage element, is a function of a word line type of the storage element to which the read operation is directed, the stored temperature value of the write operation on the storage element, the determined read temperature value of the read operation on the storage element and the data retention time value.

14. The method of claim 9 wherein the determining a demarcation voltage to apply for performing the read operation on the storage element, is performed prior to each read operation directed to the storage element.

15. The method of claim 9 wherein the determining a demarcation voltage to apply for performing the read operation on the storage element, is performed prior to a first read operation directed to the storage element following a power-up of the non-volatile memory device.

16. The method of claim 9 further comprising detecting a plurality of failures to successfully read data in a plurality of read operations directed to the storage element and wherein the determining a demarcation voltage to apply for performing a read operation on the storage element, is performed in response to detection of a plurality of failures to successfully read data in a plurality of read operations directed to the storage element.

17. A system, comprising:
a central processing unit;
a memory component, the memory component including a bitcell array of non-volatile storage elements and a memory controller configured to control memory read and memory write operations directed to the bitcell array of non-volatile storage elements; and
a temperature sensor configured to provide a temperature values indicative of memory read and write operations;
wherein the memory controller includes:
data stamp logic configured to, in response to a memory write operation for writing data on a storage element in the bitcell array of non-volatile storage elements, store a temperature value provided by the temperature sensor as a stored temperature value to indicate a temperature of the write operation on the storage element; and
voltage demarcation logic configured to, in response to receiving a request to perform a read operation to read the data written by the write operation on the storage element, determine a demarcation voltage to apply for performing the read operation on the storage element, as a function of the stored temperature value at which the write operation occurred on the storage element.

18. The system of claim 17, wherein the data stamp logic is further configured to, in response to receiving the request to perform the read operation to read the data written by the write operation on the storage element, determine a read temperature value provided by the temperature sensor, which read temperature value indicates a temperature of the read operation on the storage element, and wherein the voltage demarcation logic is configured to determine the demarcation voltage to apply for performing the read operation on the storage element, as a function of both the stored temperature value at which the write operation occurred on the storage element and the determined read temperature value of the read operation on the storage element.

19. The system of claim 18 further comprising a clock configured to indicate a time of the write operation on the storage element, wherein the data stamp logic is further configured to, in response to the write operation on the storage element, store a time value provided by the clock to indicate a time of the write operation on the storage element; and wherein the voltage demarcation logic is configured to determine a demarcation voltage to apply for performing the read operation on the storage element, as a function of the stored temperature value of the write operation on the storage element, the determined read temperature value of the read operation on the storage element and a data retention time value as a function of a duration of time following the write operation on the storage element, to the read operation on the storage element.

20. The system of claim 19 wherein the memory controller is configured to direct the write operation to the storage element to a group of storage elements so that the stored temperature value indicates a temperature of the write operation on the group of storage elements and the stored time value indicates a time of the write operation on the group of storage elements, and wherein the group of storage elements of the write operation is defined by at least one of a page, group of word lines, word line, sub-block, block, partial superblock, and full superblock.

21. The system of claim 19, wherein the memory controller further includes word line type logic configured to identify the word line type of the storage element to which the read operation is directed, and wherein the voltage demarcation logic is configured to determine a demarcation voltage to apply for performing the read operation on the storage element, as a function of a word line type of the storage element to which the read operation is directed, the stored temperature value of the write operation on the storage element, the determined read temperature value of the read operation on the storage element and the data retention time value.

22. The system of claim 17 wherein the voltage demarcation logic is configured to determine a demarcation voltage to apply for performing the read operation on the storage element, prior to each read operation directed to the storage element.

23. The system of claim 17 wherein the voltage demarcation logic is configured to determine a demarcation voltage to apply for performing the read operation on the storage element, prior to a first read operation directed to the storage element following a power-up of the memory component.

24. The system of claim 17 wherein the memory controller is configured to detect a plurality of failures to successfully read data in a plurality of read operations directed to the storage element and wherein the voltage demarcation logic is configured to determine a demarcation voltage to apply for performing a read operation on the storage element, in response to detection of a plurality of failures to successfully read data in a plurality of read operations directed to the storage element.

25. The system of claim 17 further comprising at least one of: a display communicatively coupled to the central processing unit, a network interface communicatively coupled to the central processing unit, and a battery coupled to provide power to the system.

* * * * *